United States Patent
Brask et al.

(10) Patent No.: US 9,761,724 B2
(45) Date of Patent: *Sep. 12, 2017

(54) SEMICONDUCTOR DEVICE STRUCTURES AND METHODS OF FORMING SEMICONDUCTOR STRUCTURES

(71) Applicant: Intel Corporation, Santa Clara, CA (US)

(72) Inventors: Justin K. Brask, Portland, OR (US); Jack Kavalieros, Portland, OR (US); Brian S. Doyle, Portland, OR (US); Uday Shah, Portland, OR (US); Suman Datta, Beaverton, OR (US); Amlan Majumdar, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/182,343

(22) Filed: Jun. 14, 2016

(65) Prior Publication Data

US 2016/0293765 A1 Oct. 6, 2016

Related U.S. Application Data

(60) Continuation of application No. 14/576,111, filed on Dec. 18, 2014, now Pat. No. 9,385,180, which is a
(Continued)

(51) Int. Cl.
*H01L 21/02* (2006.01)
*H01L 29/78* (2006.01)
(Continued)

(52) U.S. Cl.
CPC ...... *H01L 29/7853* (2013.01); *H01L 21/3085* (2013.01); *H01L 21/30608* (2013.01);
(Continued)

(58) Field of Classification Search
CPC .......... H01L 29/7853; H01L 29/78684; H01L 29/78681; H01L 29/51
(Continued)

(56) References Cited

U.S. PATENT DOCUMENTS

| 4,231,149 | A | 11/1980 | Chapman et al. |
| 4,487,652 | A | 12/1984 | Almgren |

(Continued)

FOREIGN PATENT DOCUMENTS

| DE | 10203998 | 8/2003 |
| GB | 2156149 | 10/1985 |

(Continued)

OTHER PUBLICATIONS

International Search Report & Written Opinion from PCT/US2006/024516 dated Jan. 10, 2007, 18 pgs.
(Continued)

*Primary Examiner* — Anthony Ho
(74) *Attorney, Agent, or Firm* — Schwabe, Williamson & Wyatt P.C.

(57) ABSTRACT

A method of patterning a semiconductor film is described. According to an embodiment of the present invention, a hard mask material is formed on a silicon film having a global crystal orientation wherein the semiconductor film has a first crystal plane and second crystal plane, wherein the first crystal plane is denser than the second crystal plane and wherein the hard mask is formed on the second crystal plane. Next, the hard mask and semiconductor film are patterned into a hard mask covered semiconductor structure. The hard mask covered semiconductor structured is then exposed to a wet etch process which has sufficient chemical strength to etch the second crystal plane but insufficient chemical strength to etch the first crystal plane.

16 Claims, 9 Drawing Sheets

Related U.S. Application Data continuation of application No. 14/048,923, filed on Oct. 8, 2013, now Pat. No. 8,933,458, which is a continuation of application No. 13/277,897, filed on Oct. 20, 2011, now Pat. No. 8,581,258, which is a division of application No. 12/463,309, filed on May 8, 2009, now Pat. No. 8,071,983, which is a division of application No. 11/158,661, filed on Jun. 21, 2005, now Pat. No. 7,547,637.

(51) Int. Cl.
  *H01L 21/306*  (2006.01)
  *H01L 21/84*  (2006.01)
  *H01L 29/04*  (2006.01)
  *H01L 29/66*  (2006.01)
  *H01L 21/308*  (2006.01)
  *H01L 29/06*  (2006.01)
  *H01L 29/51*  (2006.01)
  *H01L 29/786*  (2006.01)

(52) U.S. Cl.
  CPC ........ *H01L 21/30617* (2013.01); *H01L 21/84* (2013.01); *H01L 29/04* (2013.01); *H01L 29/045* (2013.01); *H01L 29/0657* (2013.01); *H01L 29/51* (2013.01); *H01L 29/66795* (2013.01); *H01L 29/78681* (2013.01); *H01L 29/78684* (2013.01)

(58) Field of Classification Search
  USPC ....................................................... 257/410
  See application file for complete search history.

(56) References Cited

U.S. PATENT DOCUMENTS

| | | |
|---|---|---|
| 4,711,701 A | 12/1987 | McLevige |
| 4,751,201 A | 6/1988 | Nottenburg et al. |
| 4,818,715 A | 4/1989 | Chao |
| 4,871,692 A | 10/1989 | Lee et al. |
| 4,872,046 A | 10/1989 | Morkoc et al. |
| 4,905,063 A | 2/1990 | Beltram et al. |
| 4,906,589 A | 3/1990 | Chao |
| 4,907,048 A | 3/1990 | Huang |
| 4,914,059 A | 4/1990 | Nissim et al. |
| 4,994,873 A | 2/1991 | Madan |
| 4,996,574 A | 2/1991 | Shirasaka |
| 5,023,203 A | 6/1991 | Choi |
| 5,120,666 A | 6/1992 | Gotou |
| 5,124,777 A | 6/1992 | Lee |
| 5,179,037 A | 1/1993 | Seabaugh |
| 5,216,271 A | 6/1993 | Takagi et al. |
| 5,266,518 A | 11/1993 | Binsma et al. |
| 5,278,102 A | 1/1994 | Horie |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,371,024 A | 12/1994 | Hieda et al. |
| 5,391,506 A | 2/1995 | Tada et al. |
| 5,398,641 A | 3/1995 | Shih |
| 5,428,237 A | 6/1995 | Yuzurihara et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,495,115 A | 2/1996 | Kudo et al. |
| 5,514,885 A | 5/1996 | Myrick |
| 5,521,859 A | 5/1996 | Ema et al. |
| 5,543,351 A | 8/1996 | Yoshihiko et al. |
| 5,545,586 A | 8/1996 | Koh |
| 5,554,870 A | 9/1996 | Fitch et al. |
| 5,563,077 A | 10/1996 | Ha |
| 5,576,227 A | 11/1996 | Hsu |
| 5,578,513 A | 11/1996 | Maegawa |
| 5,595,919 A | 1/1997 | Pan |
| 5,595,941 A | 1/1997 | Okamoto et al. |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,693,542 A | 12/1997 | Suh et al. |
| 5,698,869 A | 12/1997 | Yoshimi et al. |
| 5,701,016 A | 12/1997 | Burroughes et al. |
| 5,716,879 A | 2/1998 | Choi et al. |
| 5,739,544 A | 4/1998 | Koichiro et al. |
| 5,760,442 A | 6/1998 | Shigyo et al. |
| 5,770,513 A | 6/1998 | Okaniwa et al. |
| 5,773,331 A | 6/1998 | Solomon et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,544 A | 9/1998 | Huang |
| 5,814,545 A | 9/1998 | Seddon et al. |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,859,456 A | 1/1999 | Efland et al. |
| 5,880,015 A | 3/1999 | Hata |
| 5,883,564 A | 3/1999 | Partin |
| 5,888,309 A | 3/1999 | Yu |
| 5,889,304 A | 3/1999 | Watanabe |
| 5,899,710 A | 5/1999 | Mukai |
| 5,905,285 A | 5/1999 | Garnder et al. |
| 5,908,313 A | 6/1999 | Chau et al. |
| 5,952,701 A | 9/1999 | Bulucea |
| 5,965,914 A | 10/1999 | Miyamoto |
| 5,976,767 A | 11/1999 | Li |
| 5,981,400 A | 11/1999 | Lo |
| 5,985,726 A | 11/1999 | Yu et al. |
| 6,010,921 A | 1/2000 | Soutome |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,063,677 A | 5/2000 | Rodder et al. |
| 6,066,869 A | 5/2000 | Noble et al. |
| 6,087,208 A | 7/2000 | Krivokapic et al. |
| 6,093,621 A | 7/2000 | Tseng |
| 6,093,947 A | 7/2000 | Hanafi et al. |
| 6,114,201 A | 9/2000 | Wu |
| 6,114,206 A | 9/2000 | Yu |
| 6,117,697 A | 9/2000 | Seaford et al. |
| 6,117,741 A | 9/2000 | Chatterjee et al. |
| 6,120,846 A | 9/2000 | Hintermaier et al. |
| 6,124,177 A | 9/2000 | Lin |
| 6,133,593 A | 10/2000 | Boos et al. |
| 6,144,072 A | 11/2000 | Iwamatsu et al. |
| 6,150,222 A | 11/2000 | Gardner et al. |
| 6,153,485 A | 11/2000 | Pey et al. |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,262 B1 | 6/2001 | Jonker et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chao et al. |
| 6,294,416 B1 | 9/2001 | Wu |

(56) References Cited

U.S. PATENT DOCUMENTS

| | | |
|---|---|---|
| 6,307,235 B1 | 10/2001 | Forbes et al. |
| 6,310,367 B1 | 10/2001 | Yagishita et al. |
| 6,317,444 B1 | 11/2001 | Chakrabarti et al. |
| 6,319,807 B1 | 11/2001 | Yeh et al. |
| 6,320,212 B1 | 11/2001 | Chow |
| 6,335,251 B2 | 1/2002 | Miyano et al. |
| 6,346,450 B1 | 2/2002 | Deleonibus et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,406,795 B1 | 6/2002 | Hwang et al. |
| 6,407,442 B2 | 6/2002 | Inoue et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee et al. |
| 6,483,151 B2 | 11/2002 | Wakabayashi et al. |
| 6,483,156 B1 | 11/2002 | Adkisson et al. |
| 6,495,403 B1 | 12/2002 | Skotnicki |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus et al. |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,607,948 B1 | 8/2003 | Sugiyama et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,705,571 B2 | 3/2004 | Yu et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Mathew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,884,154 B2 | 4/2005 | Mizushima et al. |
| 6,885,055 B2 | 4/2005 | Lee |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,949,433 B1 | 9/2005 | Ke et al. |
| 6,955,961 B1 | 10/2005 | Chung |
| 6,956,281 B2 | 10/2005 | Smith et al. |
| 6,960,517 B2 | 11/2005 | Rios et al. |
| 6,967,351 B2 | 11/2005 | Fried et al. |
| 6,969,878 B2 | 11/2005 | Coronel et al. |
| 6,970,373 B2 | 11/2005 | Datta et al. |
| 6,974,738 B2 | 12/2005 | Hareland et al. |
| 6,975,014 B1 | 12/2005 | Krivokapic et al. |
| 6,977,415 B2 | 12/2005 | Matsuo |
| 6,982,433 B2 | 1/2006 | Hoffman et al. |
| 6,998,301 B1 | 2/2006 | Yu et al. |

(56) References Cited

U.S. PATENT DOCUMENTS

| | | |
|---|---|---|
| 6,998,318 B2 | 2/2006 | Park |
| 7,005,366 B2 | 2/2006 | Chau et al. |
| 7,013,447 B2 | 3/2006 | Mathew et al. |
| 7,018,551 B2 | 3/2006 | Beintner et al. |
| 7,041,601 B1 | 5/2006 | Yu et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo et al. |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay et al. |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,119,402 B2 | 10/2006 | Kinoshita et al. |
| 7,122,463 B2 | 10/2006 | Ohuchi |
| 7,132,360 B2 | 11/2006 | Schaeffer et al. |
| 7,138,320 B2 | 11/2006 | Van Bentum et al. |
| 7,141,480 B2 | 11/2006 | Adam et al. |
| 7,141,856 B2 | 11/2006 | Lee et al. |
| 7,154,118 B2 | 12/2006 | Lindert |
| 7,163,851 B2 | 1/2007 | Adadeer et al. |
| 7,163,898 B2 | 1/2007 | Mariani et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,214,991 B2 | 5/2007 | Yeo et al. |
| 7,235,822 B2 | 6/2007 | Li |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,367 B2 | 7/2007 | Vaartstra et al. |
| 7,250,645 B1 | 7/2007 | Wang et al. |
| 7,268,024 B2 | 9/2007 | Yeo et al. |
| 7,273,785 B2 | 9/2007 | Dennard et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,329,913 B2 | 2/2008 | Brask et al. |
| 7,339,241 B2 | 3/2008 | Orlowski et al. |
| 7,341,902 B2 | 3/2008 | Anderson et al. |
| 7,348,284 B2 | 3/2008 | Doyle et al. |
| 7,348,642 B2 | 3/2008 | Nowak |
| 7,354,817 B2 | 4/2008 | Watanabe et al. |
| 7,358,121 B2 | 4/2008 | Chau et al. |
| 7,388,259 B2 | 6/2008 | Doris et al. |
| 7,396,730 B2 | 7/2008 | Li |
| 7,439,120 B2 | 10/2008 | Pei |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,573,059 B2 | 8/2009 | Hudait et al. |
| 7,585,734 B2 | 9/2009 | Kang et al. |
| 7,612,416 B2 | 11/2009 | Takeuchi et al. |
| 7,615,429 B2 | 11/2009 | Kim et al. |
| 7,655,989 B2 | 2/2010 | Zhu et al. |
| 7,701,018 B2 | 4/2010 | Yamagami et al. |
| 8,581,258 B2 | 11/2013 | Brask et al. |
| 8,933,458 B2 | 1/2015 | Brask et al. |
| 9,385,180 B2 * | 7/2016 | Brask ............... H01L 21/30608 |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2002/0185655 A1 | 12/2002 | Fahimulla et al. |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0080332 A1 | 5/2003 | Phillips |
| 2003/0080384 A1 | 5/2003 | Takahashi et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0190766 A1 | 10/2003 | Gonzalez et al. |
| 2003/0201458 A1 | 10/2003 | Clark et al. |
| 2003/0203636 A1 | 10/2003 | Hieda |
| 2003/0227036 A1 | 12/2003 | Sugiyama et al. |
| 2004/0016968 A1 | 1/2004 | Coronel et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075141 A1 | 4/2004 | Shigenobu et al. |
| 2004/0075149 A1 | 4/2004 | Fitzgerald et al. |
| 2004/0082125 A1 | 4/2004 | Hou |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0110331 A1 | 6/2004 | Yeo et al. |
| 2004/0113181 A1 | 6/2004 | Wicker |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |

(56) References Cited

U.S. PATENT DOCUMENTS

| | | |
|---|---|---|
| 2004/0219711 A1 | 11/2004 | Wu et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2004/0266076 A1 | 12/2004 | Doris et al. |
| 2005/0003612 A1 | 1/2005 | Hackler et al. |
| 2005/0017377 A1 | 1/2005 | Joshi et al. |
| 2005/0019993 A1 | 1/2005 | Lee et al. |
| 2005/0020020 A1 | 1/2005 | Collaert et al. |
| 2005/0023535 A1 | 2/2005 | Sriram |
| 2005/0023633 A1 | 2/2005 | Yeo et al. |
| 2005/0035415 A1 | 2/2005 | Yeo et al. |
| 2005/0040429 A1 | 2/2005 | Uppal |
| 2005/0040444 A1 | 2/2005 | Cohen |
| 2005/0059214 A1 | 3/2005 | Cheng et al. |
| 2005/0062082 A1 | 3/2005 | Bucher et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0110082 A1 | 5/2005 | Cheng et al. |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehret |
| 2005/0133829 A1 | 6/2005 | Kunii et al. |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert et al. |
| 2005/0227498 A1 | 10/2005 | Furkawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu et al. |
| 2005/0263821 A1 | 12/2005 | Cho et al. |
| 2005/0266622 A1 | 12/2005 | Arghavani et al. |
| 2005/0266645 A1 | 12/2005 | Park |
| 2005/0272192 A1 | 12/2005 | Oh et al. |
| 2005/0277294 A1 | 12/2005 | Schaefer et al. |
| 2005/0280121 A1 | 12/2005 | Doris et al. |
| 2005/0287752 A1 | 12/2005 | Nouri et al. |
| 2006/0001095 A1 | 1/2006 | Doris et al. |
| 2006/0014338 A1 | 1/2006 | Doris et al. |
| 2006/0040054 A1 | 2/2006 | Pearlstein et al. |
| 2006/0043500 A1 | 3/2006 | Chen et al. |
| 2006/0046521 A1 | 3/2006 | Vaartstra et al. |
| 2006/0057792 A1 | 3/2006 | Mathew et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071275 A1 | 4/2006 | Brask et al. |
| 2006/0071299 A1 | 4/2006 | Doyle et al. |
| 2006/0086977 A1 | 4/2006 | Shah et al. |
| 2006/0091432 A1 | 5/2006 | Guha et al. |
| 2006/0113605 A1 | 6/2006 | Currie |
| 2006/0148182 A1 | 7/2006 | Datta et al. |
| 2006/0154478 A1 | 7/2006 | Hsu et al. |
| 2006/0170066 A1 | 8/2006 | Mathew et al. |
| 2006/0172479 A1 | 8/2006 | Furukawa et al. |
| 2006/0172480 A1 | 8/2006 | Wang et al. |
| 2006/0172497 A1 | 8/2006 | Hareland et al. |
| 2006/0180859 A1 | 8/2006 | Radosavljevic et al. |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1 | 10/2006 | Lee et al. |
| 2006/0244066 A1 | 11/2006 | Yeo et al. |
| 2006/0263699 A1 | 11/2006 | Abatchev et al. |
| 2006/0281325 A1 | 12/2006 | Chou et al. |
| 2006/0286729 A1 | 12/2006 | Kavalieros et al. |
| 2007/0001219 A1 | 1/2007 | Radosavljevic et al. |
| 2007/0004117 A1 | 1/2007 | Yagishita |
| 2007/0023795 A1 | 2/2007 | Nagano et al. |
| 2007/0029624 A1 | 2/2007 | Nowak |
| 2007/0045735 A1 | 3/2007 | Orlowski et al. |
| 2007/0045748 A1 | 3/2007 | Booth, Jr. et al. |
| 2007/0048930 A1 | 3/2007 | Figura et al. |
| 2007/0052041 A1 | 3/2007 | Sorada et al. |
| 2007/0069293 A1 | 3/2007 | Kavalieros et al. |
| 2007/0069302 A1 | 3/2007 | Jin et al. |
| 2007/0090416 A1 | 4/2007 | Doyle et al. |
| 2007/0093010 A1 | 4/2007 | Mathew et al. |
| 2007/0108514 A1 | 5/2007 | Inoue et al. |
| 2007/0145487 A1 | 6/2007 | Kavalieros et al. |
| 2007/0148937 A1 | 6/2007 | Yagishita et al. |
| 2007/0187682 A1 | 8/2007 | Takeuchi et al. |
| 2007/0241414 A1 | 10/2007 | Narihiro |
| 2007/0259501 A1 | 11/2007 | Xiong et al. |
| 2007/0262389 A1 | 11/2007 | Chau et al. |
| 2008/0017890 A1 | 1/2008 | Yuan et al. |
| 2008/0017934 A1 | 1/2008 | Kim et al. |
| 2008/0102586 A1 | 5/2008 | Park |
| 2008/0111163 A1 | 5/2008 | Russ et al. |
| 2008/0116515 A1 | 5/2008 | Gossner et al. |
| 2008/0128796 A1 | 6/2008 | Zhu et al. |
| 2008/0128797 A1 | 6/2008 | Dyer et al. |
| 2008/0212392 A1 | 9/2008 | Bauer |
| 2008/0237655 A1 | 10/2008 | Nakabayashi et al. |
| 2008/0258207 A1 | 10/2008 | Radosavljevic et al. |
| 2009/0061572 A1 | 3/2009 | Hareland et al. |
| 2009/0090976 A1 | 4/2009 | Kavalieros et al. |
| 2009/0099181 A1 | 4/2009 | Wurster et al. |
| 2010/0200923 A1 | 8/2010 | Chen et al. |

FOREIGN PATENT DOCUMENTS

| | | |
|---|---|---|
| JP | 59145538 | 8/1984 |
| JP | 2303048 | 12/1990 |
| TW | 200414538 | 8/1992 |
| TW | 200518310 | 11/1992 |

OTHER PUBLICATIONS

International Preliminary Report on Patentability from Application No. PCT/US2006/024516 dated Jan. 10, 2008, 11 pgs.

Final Office Action from U.S. Appl. No. 11/158,661 dated Jan. 15, 2008, 25 pgs.

Office Action from Taiwan Patent Application No. 95122087 dated Dec. 16, 2008, 14 pgs.

(56) References Cited

OTHER PUBLICATIONS

Office Action from Taiwan Patent Application No. 95122087 dated Jun. 20, 2008, 8 pgs.
Second Office Action for Chinese Application No. 200680021817.0 dated Dec. 11, 2009, 11 pgs.
Office Action for Chinese Patent Application No. 200680021817.0 dated Jun. 12, 2009, 11 pages.
Office Action for Application No. 112006001589.3 dated Dec. 20, 2011, 9 pages.
Non-Final Office Action for U.S. Appl. No. 11/158,661 dated Jun. 4, 2007, 26 pgs.
Non-Final Office Action for U.S. Appl. No. 11/158,661 dated Sep. 17, 2007, 42 pgs.
Non-Final Office Action for U.S. Appl. No. 11/158,661 dated Jun. 30, 2008, 24 pgs.
Final Office Action for U.S. Appl. No. 11/158,661 dated Nov. 25, 2008, 7 pgs.
Non-Final Office Action for U.S. Appl. No. 12/463,309 dated Feb. 2, 2011, 31 pgs.
Non-Final Office Action for U.S. Appl. No. 13/277,897 dated Mar. 6, 2013, 19 pgs.
Final Office Action for U.S. Appl. No. 14/048,923 dated May 29, 2014, 6 pgs.
Non-Final Office Action for U.S. Appl. No. 14/048,923 dated Nov. 8, 2013, 23 pgs.
Non-Final Office Action for U.S. Appl. No. 14/048,923 dated Feb. 20, 2014, 6 pgs.
Non-Final Office Action for U.S. Appl. No. 14/576,111 dated Nov. 10, 2015, 23 pgs.
Chang, L., et al., CMOS Circuit Performance Enhancement by Surface Orientation Optimization, IEEE Transactions on Electron Devices, vol. 51, No. 10, Oct. 2004, 7 pgs.
Park, Jae-Hyoun, et al., Quantum-Wired MOSFET Photodetector Fabricated by Conventional Photolighography on SOI Substrate, Nanotechnology, 4th IEEE Conference on Munich, Germany, Aug. 16-19, 2004, Piscataway, NJ, 3 pgs.
Tokoro, Kenji, et al., Anisotropic Etching Properties of Silicon in KOH and TMAH Solutions, International Symposium on Micromechatronics and Human Science, IEEE, 1998, 6 pgs.
Wolf, Stanley, et al., Silicon Processing for the VLSI Era, vol. 1: Process Technology, Lattice Press, Sep. 1986, 3 pgs.
Non-Final Office Action for German Patent Application No. 112006001589.3 dated Mar. 31, 2009, 3 pgs.
Non-Final Office Action for German Patent Application No. 112006001589.3 dated Aug. 8, 2011, 5 pgs.

\* cited by examiner

_US 9,761,724 B2_

SEMICONDUCTOR DEVICE STRUCTURES AND METHODS OF FORMING SEMICONDUCTOR STRUCTURES

CROSS-REFERENCE TO RELATED APPLICATIONS

This application is a continuation of U.S. patent application Ser. No. 14/576,111, filed Dec. 18, 2014, which is a continuation of U.S. patent application Ser. No. 14/048,923, filed Oct. 8, 2013, now U.S. Pat. No. 8,933,458, issued on Jan. 13, 2015, which is a continuation of U.S. patent application Ser. No. 13/277,897, filed Oct. 20, 2011, now U.S. Pat. No. 8,581,258, issued on Nov. 12, 2013, which is a divisional of U.S. patent application Ser. No. 12/463,309, filed May 8, 2009, now U.S. Pat. No. 8,071,983, issued on Dec. 6, 2011, which is a divisional of U.S. patent application Ser. No. 11/158,661, filed Jun. 21, 2005, now U.S. Pat. No. 7,547,637, issued on Jun. 16, 2009, the entire contents of which are hereby incorporated by reference herein.

BACKGROUND OF THE INVENTION

1. Field of the Invention

The present invention relates to the field of semiconductor processing and more particularly to semiconductor structures and their methods of fabrication.

2. Discussion of Related Art

In order to increase the performance of modern integrated circuits, such as microprocessors, silicon on insulator (SOI) transistors have been proposed. Silicon on insulator (SOI) transistors have an advantage in that they can be operated in a fully depleted manner. Fully depleted transistors have an advantage of ideal subthreshold gradients for optimized on current/off current ratios. An example of a proposed SOI transistor which can be operated in a fully depleted manner is that of a tri-gate transistor 100, such as illustrated in FIG. 1. Tri-gate transistor 100 includes a silicon body 104 formed on insulating substrate 102 having buried oxide layer 103 formed on a monocrystalline silicon substrate 105. A gate dielectric layer 106 is formed on the top and sidewalls of the silicon body 104 as shown in FIG. 1. A gate electrode 108 is formed on the gate dielectric layer and surrounds the body 104 on three sides essentially providing a transistor 100 having three gate electrodes (G1, G2, G3) one on each of the sidewalls of the silicon body 104 and one on the top surface of the silicon body 104. A source region 110 and a drain region 112 are formed in silicon body 104 on opposite sides of gate electrode 108 as shown in FIG. 1. The active channel region is the region of the silicon body located beneath gate electrode 108 and between the source region 110 and drain region 112. An advantage of a tri-gate transistor 100 is that it exhibits good short channel effects (SCEs). One reason tri-gate transistors 100 exhibit good short channel effects is that the nonplanarity of such devices places the gate electrode 108 in such a way as to surround the active channel region on all three sides.

DETAILED DESCRIPTION OF THE PRESENT INVENTION

Figure 1:
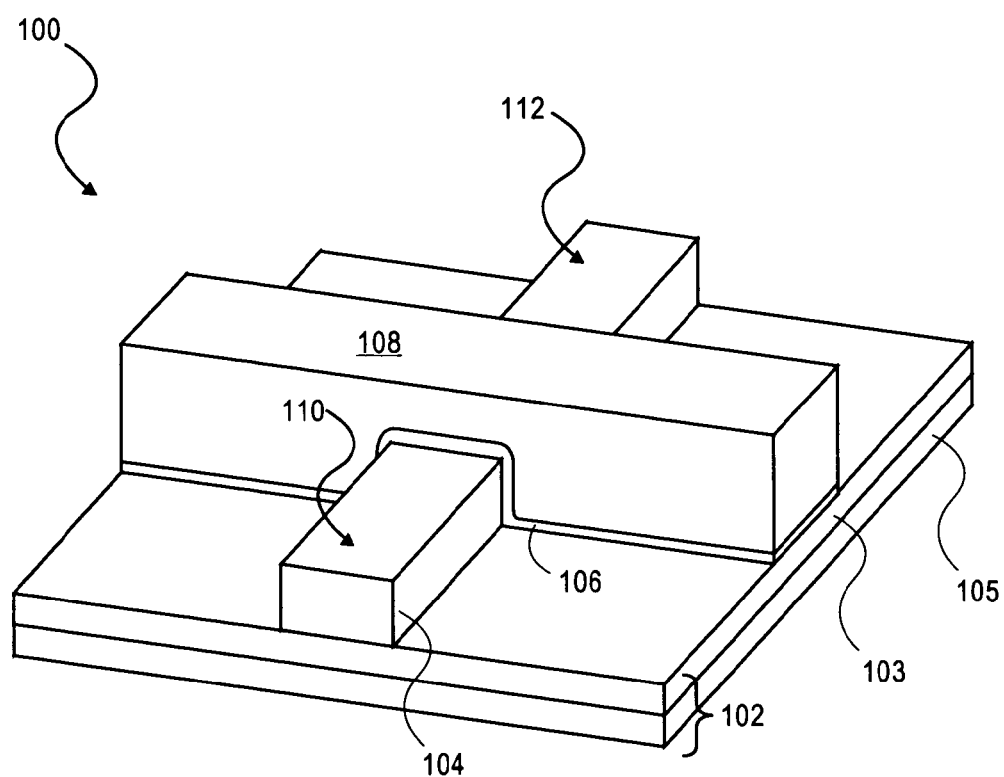
FIG. 1 illustrates a nonplanar or tri-gate transistor.

Embodiments of the present invention describe semiconductor structures and methods of forming semiconductor structures. In the following description numerous specific details are set forth in order to provide a thorough understanding of the present invention. In other instances, well known semiconductor processes and manufacturing techniques have not been described in particular detail in order to not unnecessarily obscure the present invention.

The present invention utilizes atomic layer control of single crystalline semiconductor structures to maximize performance of semiconductor devices. In embodiments of the present invention, hard mask covered single crystalline structures are exposed to anisotropic wet etches. The wet etch has sufficient chemical strength to overcome the activation energy barrier of the chemical etching reaction in order to etch less dense planes of the semiconductor structure, but insufficient chemical strength to overcome the activation energy barrier of the chemical etching reaction, thereby not etching high density planes. By choosing proper crystal orientation and by forming a hard mask over the less dense planes of the structure and by using a wet etch chemistry with the appropriate chemical strength, one can form semiconductor structures with desired faceting, crystal orientation and sidewall smoothing. In embodiments of the present invention, natural facets in epitaxial silicon are exploited to negate edge roughness in three-dimensional silicon channel structures. In an embodiment of the present invention, natural facets are exploited to form a three-dimensional channel structure which enables good gate control of the channel region. In yet other embodiments of the present invention, semiconductor bodies of PMOS and NMOS transistors are formed with specific arrangement on single crystalline semiconductors to exploit the crystal orientation and achieve increased mobility for both holes and electrons. Other aspects of the present invention will become obvious from the detailed description which follows.

A method of forming a three-dimensional semiconductor structure utilizing a self limiting etch and natural faceting is illustrated in FIGS. 2A-2F in accordance with embodiments of the present invention. The fabrication of a semiconductor structure begins with a substrate 200. In an embodiment of the present invention, substrate 200 is a silicon on insulator (SOI) substrate. A SOI substrate 200 includes a lower monocrystalline silicon substrate 202. An insulating layer 204, such as silicon dioxide or silicon nitride, is formed on monocrystalline substrate 202. A single crystalline silicon film 206 is formed on the top of the insulating layer 204 insulating layer 204 is sometimes referred to as a "buried oxide" or a "buried insulating" layer and is formed to a thickness sufficient to isolate single crystalline silicon film 206 from lower monocrystalline silicon substrate 202. In an embodiment of the present invention, the insulating layer is a buried oxide layer formed to a thickness between 200-2000 Å. In an embodiment of the present invention, the silicon, film 206 is an intrinsic (i.e. undoped) silicon epitaxial film. In other embodiments, the single crystalline silicon film 206 is doped to a p type or n type conductivity with a concentration level between $1\times10^{16}$-$1\times10^{19}$ atom/cm$^3$. Silicon film 206 can be in situ doped (i.e., doped while it is deposited) or doped after it is formed on insulating layer 204 by, for example, ion implantation. Doping silicon film 206 after it is deposited enables both n type devices and p type devices to be fabricated on the same substrate in an embodiment of the present invention, silicon film 206 is formed to a thickness which is approximately equal to the height desired of the subsequently formed n structure. In an embodiment of the present invention, the single crystalline silicon film 206 has a thickness of less than 30 nanometers and ideally around 20 nanometers or less.

A silicon on insulator (SOI) substrate 200 can be formed in a well known method. In one method of forming the silicon insulator substrate, known as the SIMOX technique, oxygen atoms are implanted at a high dose into a single crystalline silicon substrate and then annealed to form buried oxide 204 within the substrate. The portion of the single crystalline silicon substrate above the buried oxide becomes the silicon film 206. Another technique currently used to form SOI substrates is an epitaxial silicon film transfer technique which is generally referred to as "bonded SOI". In this technique, a first silicon wafer has a thin oxide grown on its surface that will later serve as the buried oxide 204 in the SOL structure. Next, a high dose hydrogen implant is made into the first silicon wafer to form a stress region below the silicon surface of the first wafer. The first wafer is then flipped over and bonded to the surface of a second silicon wafer. The first wafer is then cleaved along the high stress plane created by the hydrogen implant. The cleaving results in a SOI structure with a thin silicon layer on top, the buried oxide underneath, all on top of the second single crystalline silicon wafer. Well known smoothing techniques, such as HCl smoothing or chemical mechanical polishing (CMP) can be used to smooth the top surface of the silicon film 206 to its desired thickness.

Although the present invention will be described with respect to silicon structures formed on silicon on insulator (SOI) substrates, the present invention can be carried out on standard monocrystalline silicon wafers or substrates to form a "bulk" device. The silicon structures can be formed directly from the monocrystalline silicon wafer or formed from epitaxial silicon films formed on a monocrystalline silicon substrate. Additionally, although embodiments of the present invention are illustrated with respect to the formation of single crystalline silicon structures and devices formed therefrom, the methods and structures of the present invention are equally applicable to other types of semiconductors, such as but not limited to germanium (Ge), a silicon germanium alloy ($Si_xGe_y$), gallium arsenide (GaAs), indium antimonide (InSb), gallium phosphide (GaP), and gallium antimonide (GaSb). Accordingly, embodiments of the present invention include semiconductor structures and methods of forming semiconductor structures utilizing semiconductors, such as but not limited to germanium (Ge), a silicon germanium alloy ($Si_xGe_y$), gallium arsenide (GaAs), indium antimonide (InSb), gallium phosphide (GaP), and gallium antimonide (GaSb).

Figure 2A:
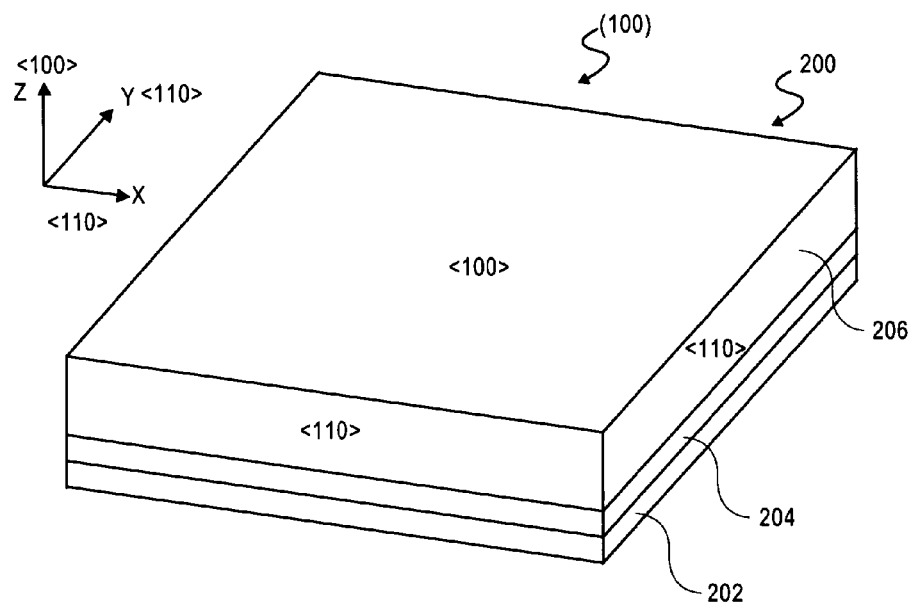
FIGS. 2A-2E illustrate a method of forming a semiconductor structure in accordance with embodiments of the present invention.

In FIG. 2A, single crystalline silicon film 206 has a (100) global crystal orientation, as defined by the $\overline{xy}$ plane. A silicon film with a (100) global crystal orientation has a <100> plane which is planar with the surface of the film. That is, as illustrated in FIG. 2A, a single crystalline silicon film with a (100) global crystal orientation has a <100> plane which lies in the $\overline{xy}$ plane with a normal axis in the z direction.

In the following description round brackets ( ) are used to illustrate the global crystal orientation of the film, as defined by the $\overline{xy}$ plane and along the z direction, while pointed brackets < > are used to describe specific local planes within said globally defined crystalline film.

Additionally, as illustrated in FIG. 2A, a single crystalline silicon with a (100) crystal orientation has a pair of <110> planes which are perpendicular to one another. That is, the (100) single crystalline silicon has a <110> plane which lies in the $\overline{zx}$ plane with a normal axis extending in the y direction and has a <110> plane which lies in the $\overline{zy}$ plane and with a normal axis in the x direction. In an embodiment of the present invention, silicon film 206 with a (100) global crystal orientation is etched to form a silicon structure which has a pair of laterally opposite sidewalls which are formed from the <110> plane and a second pair of laterally opposite sidewalls, perpendicular thereto, which lie in the <110> plane.

In order to etch silicon film 206 into a silicon body, a hard mask material 208 can be formed on the top surface 219 of silicon film 206. Hard mask material 208 is a material which can provide a hard mask for etching of silicon film 206. Hard mask material 208 is a material which can retain its profile during the etching of silicon film 206. Hard mask material 208 is a material which will not etch or will only slightly etch during the etching of silicon film 206. In an embodiment of the present invention, the hard mask material is formed of a material such that the etchant used to etch silicon film 206 will etch silicon film 206 at least 5 times faster than the hard mask material and ideally at least 10 times faster. That is, in an embodiment of the present invention, the silicon film and the hard mask are chosen to provide an etch selectivity of at least 5:1 and ideally at least 10:1. It an embodiment of the present invention, hard mask material 208 is formed from silicon nitride or silicon oxynitride. In an embodiment of the present invention, hard mask material 208 is formed from a silicon nitride film with between 0-5% carbon, formed by a low pressure chemical vapor deposition (LPCVD) process. Hard mask material 208 is formed to a thickness sufficient to retain its profile during the entire etch of silicon film 206 but not too thick to cause difficulties in patterning. In an embodiment of the present invention, the hard mask material 208 is formed to a thickness between 3 nanometers to 50 nanometers and ideally to a thickness around 10 nanometers.

Figure 2B:
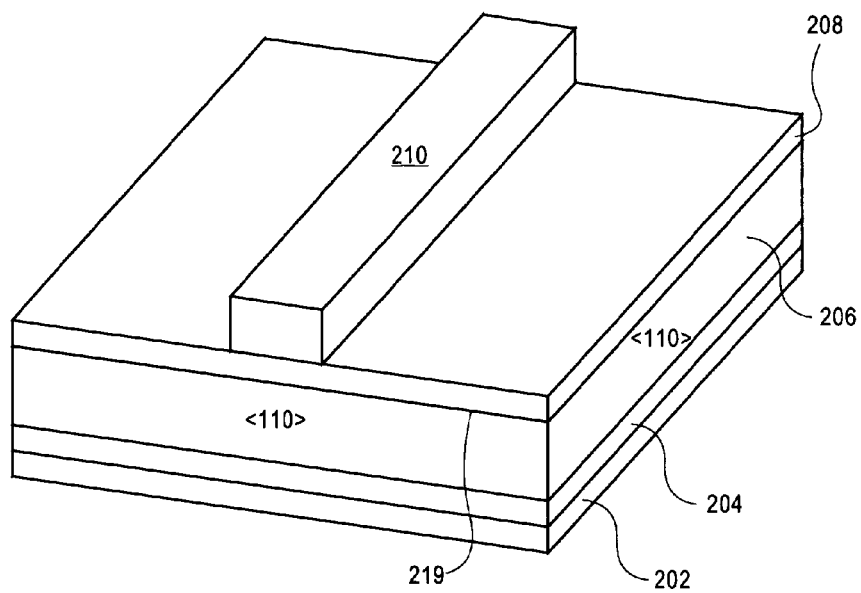

Next, as also shown in FIG. 2B, a photoresist mask 210 is formed on hard mask material 208. Photoresist mask 210 contains the feature pattern to be transferred into silicon film 206. Photoresist mask 210 can be formed by any well known technique, such as by blanket depositing photoresist material and then masking, exposing and developing the photoresist material into a photoresist mask 210 having the desired pattern for a silicon film 206. Photoresist mask 210 is typically formed of an organic compound. Photoresist mask 210 is formed to a thickness sufficient to retain its profile while patterning hard mask film 208 but yet is not formed too thick to prevent its lithographic patterning into the smallest dimensions (i.e., critical dimensions) possible with the photolithography system and process used. In an embodiment of the present invention, photoresist mask 210 is orientated on single crystalline silicon film 206 so as to define a photoresist mask with a pair of laterally opposite sidewalls aligned with a <110> crystal plane and a second pair of laterally opposite sidewalls, perpendicular to the first, aligned with the <110> plane.

Figure 2C:
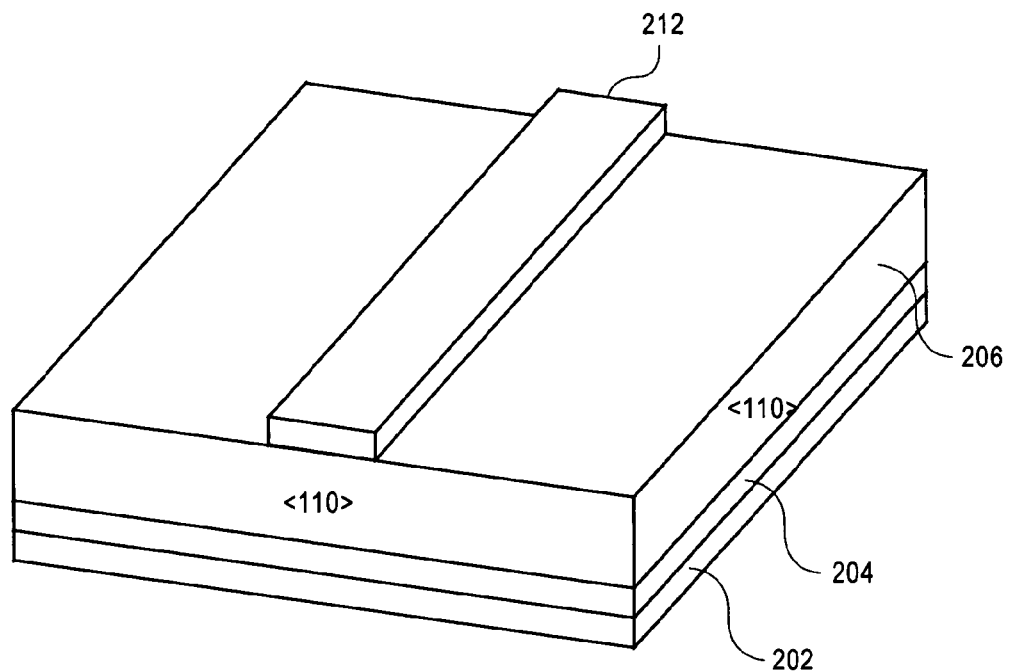

Next, as shown in FIG. 2C, hard mask material 208 is etched in alignment with photoresist mask 210 to form a hard mask 212 as shown in FIG. 2C. Photoresist mask 210 prevents the underlying portion of hard mask material 208 from being etched. In an embodiment of the present invention, the hard mask material 208 is etched with an etchant which can etch the hard mask material but does not etch the underlying silicon film 206. In an embodiment of the present invention, the hard mask material is etched with an etchant that has almost perfect selectivity to the underlying silicon film 206. That is, in an embodiment of the present invention, the hard mask etchant etches the hard mask material 208 at least 20 times faster than the underlying silicon film 206 (i.e., etchant has a hard mask to silicon film selectivity of at least 20:1). When hard mask material 208 is a silicon nitride or silicon oxynitride film, hard mask material 208 can be etched into a hard mask 212 utilizing a dry etch process, such as a reactive ion etching. In an embodiment of the present invention, a silicon nitride or silicon oxynitride hard mask is reactively ion etched utilizing a chemistry comprising $CHF_3$ and $O_2$ and Ar.

Next, as also shown in FIG. 2C, after hard mask film 208 has been patterned into a hard mask 212, photoresist mask 210 may be removed by well known techniques. For example, photoresist mask 210 may be removed utilizing "piranha" clean solution which includes sulfuric acid and hydrogen peroxide. Additionally, residue from the photoresist mask 210 may be removed with an $O_2$ ashing.

Although not required, it is desirable to remove photoresist mask 210 prior to patterning silicon film 206 so that a polymer film from the photoresist does not form on the sidewalls of the patterned silicon film 206. For example, when silicon film 206 is used as a semiconductor body or fin in a nonplanar device, it is desirable to first remove the photoresist mask prior to etching the silicon film because thy etching processes can erode the photoresist mask and cause polymer films to develop on the sidewalls of the silicon body which can be hard to remove and which can detrimentally affect device performance.

Figure 2D:
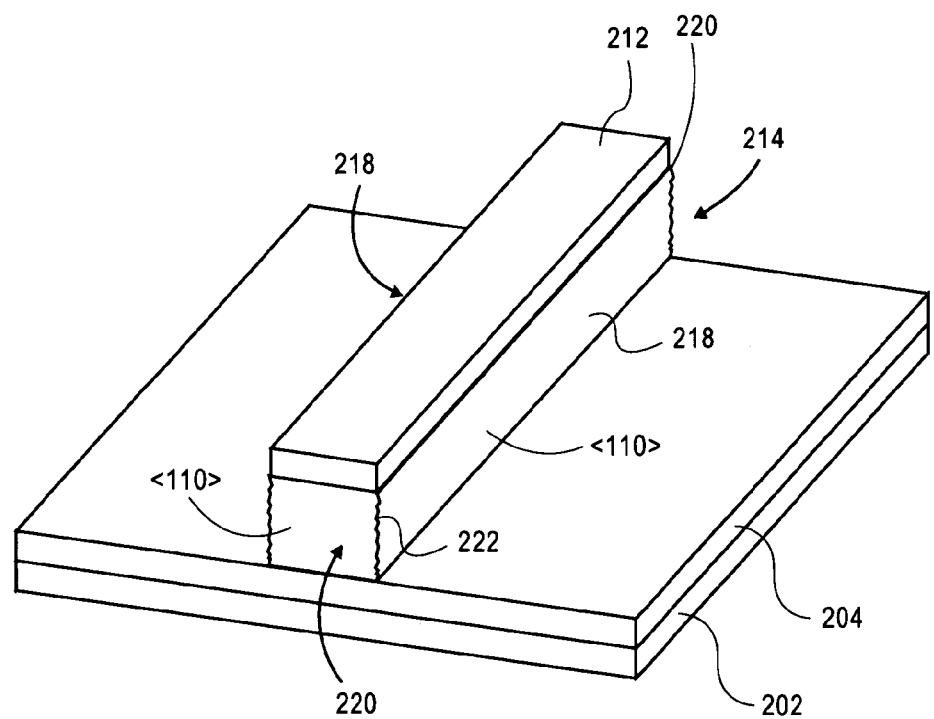

Next, as shown in FIG. 2D, silicon film 206 is etched in alignment with hard mask 212 to form a patterned silicon film 214 which has a first pair of laterally opposite sidewalls 218 aligned with the <110> crystal plane and a second pair of laterally opposite sidewalls 220 aligned with the <110> crystal plane. Hard mask 212 prevents the underlying portion of silicon film 206 from being etched during the etch process, in an embodiment of the present invention, the etch is continued until the underlying buried oxide layer 204 is reached. Silicon film 206 is etched with an etchant which etches silicon film 206 without significantly etching hard mask 212. In an embodiment of the present invention, silicon film 206 is etched with an etchant which enables silicon film 206 to be etched at least 5 times and ideally 10 times faster than hard mask 212 etchant has a silicon film 206 to hard mask 212 etch selectivity of at least 5:1 and ideally at least 10:1). Silicon film 206 can be etched utilizing any suitable process. In an embodiment of the present invention, silicon film 206 is anisotropically etched so that the silicon body 214 has nearly vertical sidewalls 218 formed in alignment with the sidewalls of hard mask 212. When hard mask. 212 is a silicon nitride or silicon oxynitride film, silicon film 206 can be etched utilizing a dry etch process, such as a reactive ion etch (RIE) or plasma etch with a chemistry comprising $Cl_2$ and HBr.

After etching silicon film 206 to form silicon body or structure 214, the sidewalls 218 will typically have a line edge roughness 222 of about 2-4 nanometers. When forming a silicon body or structure with a width between sidewalls 218 of only 20-30 nanometers, such a surface roughness is unacceptably large and can detrimentally affect device performance.

Accordingly, in an embodiment of the present invention, the silicon structure 214 is exposed to a wet etch or a "faceting" etch while hard mask 212 is present on structure 214 in order to remove the edge roughness and/or to tailor the shape of the structure to enhance device performance. In an embodiment of the present invention, the hard mask 212 capped silicon structure 214, is exposed to an anisotropic wet etch. The wet etchant has sufficient chemical strength to overcome the activation energy barrier of the chemical etching reaction in order to etch less dense planes of the semiconductor structure, but insufficient chemical strength to overcome the activation energy barrier of the chemical etching reaction, thereby not etching high density planes.

Figure 2E:
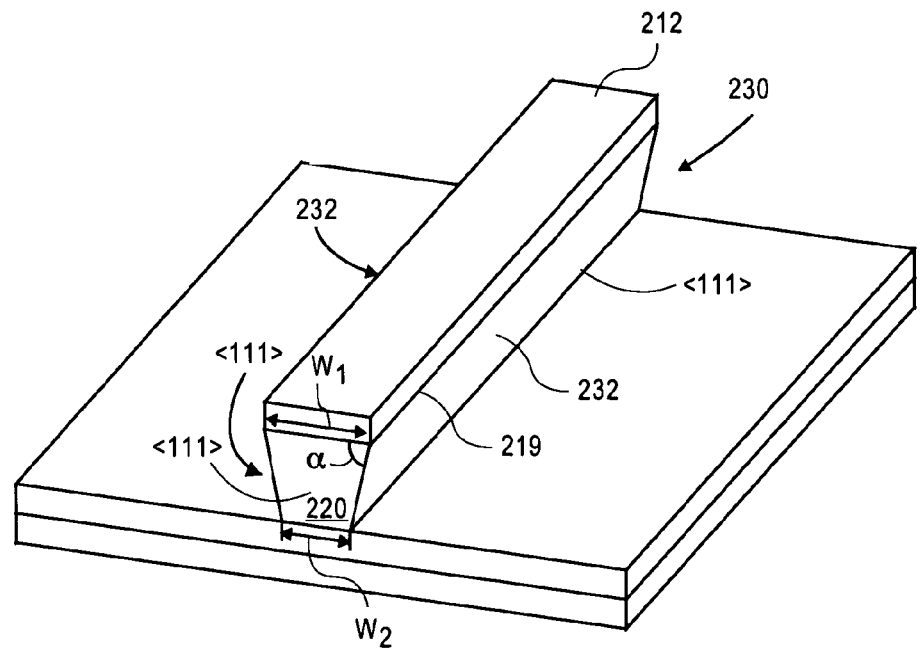

In an embodiment of the present invention, a wet etch chemistry and process are used which can etch the less dense <100> and <110> planes, but which cannot etch the higher density <111> planes. Because hard mask 212 covers, the less dense <100> plane on the top surface of the silicon structure 214, said less dense plane is protected from etching. Because the less dense plane <100> on the top surface is shielded and because the etch does not have a sufficient chemical strength to etch the <111> plane, the wet, etch stops on, the first total intact or contiguous <111> plane as shown in FIG. 2E. In this way, the "faceting" or wet etch is self limiting. Thus, upon self-limitation of the yet etch, only <111> planes and etch-resistant films used, to shield the less dense <110> and <100> planes remain exposed. The faceting etch of the present invention can be said to be an anisotropic etch because it etches in one direction at one rate while etching in other directions at a second slower rate or not at all. Because the etch process etches the <100> and <110> planes but not the <111> planes, the faceting or wet etch forms a silicon structure 230 having sidewalls 232 defined by the <111> plane as shown in FIG. 2E. The anisotropic wet etch removes the surface roughness 222 from sidewalls 218 (FIG. 2D) and generates optically smooth sidewalls 232 as shown in FIG. 2E. Additionally, after exposing the structure 214 to the faceting etch for a sufficient period of time, sidewalls 218 are defined by the <111> plane and generate a structure 230 with a v-shape or inwardly tapered sidewalls 232. The sidewalls 232 angle inward from the top surface 219 of structure 230 at an angle alfa of 62.5 degrees. In an embodiment of the present invention, the top surface 219 of structure 230 has a width (W1) between laterally opposite sidewalk 232 of between 20-30 nm and the bottom surface has a width (W2) between laterally opposite sidewalk of between 10-15 nm.

In an embodiment of the present invention, the wet etch or "faceting" etch is a hydroxide based etch with a sufficiently low hydroxide concentration and nucleophillicity (i.e. chemical strength) so that there is no etching of the fully intact <111> planes. In an embodiment of the present invention, structure 214 is exposed to a faceting or wet etch which comprises less than 1% ammonia hydroxide ($NH_4OH$) by volume. In an embodiment of the present invention, structure 214 is exposed to a wet etchant comprising between 0.2-1% $NH_4OH$ by volume at a temperature range between 5-25° C. In an embodiment of the present invention, sonic energy at the frequency range between 600-800 kilohertz dissipating between 0.5-3 watts/cm$^2$ is applied to the etch solution during the faceting etch. In an embodiment of the present invention, the hard mask capped silicon structure is exposed to the beefing etch for between 15 seconds-5 minutes.

In another embodiment of the present invention, the faceting or wet etch can comprise ultra-dilute (<0.1% by volume) aqueous solutions of tetraalkylammonium hydroxides (e.g. tetraethylammonium hydroxide and tetramethylammonium hydroxide at a temperature between 5 and 20° C.).

The fabricated silicon structure 230 can be used to fabricate semiconductor devices, such as transistors and capacitors, as well as micro-electrical mechanical systems (MEMS) and opto-electronic devices. In an embodiment of the present invention, semiconductor structure 230 is used as a semiconductor body or fin for a nonplanar or three-dimensional transistor, such as but not limited to a tri-gate transistor, a dual gate transistor, a FINFET, an omega-FET or a pi-FET.

Figure 2F:
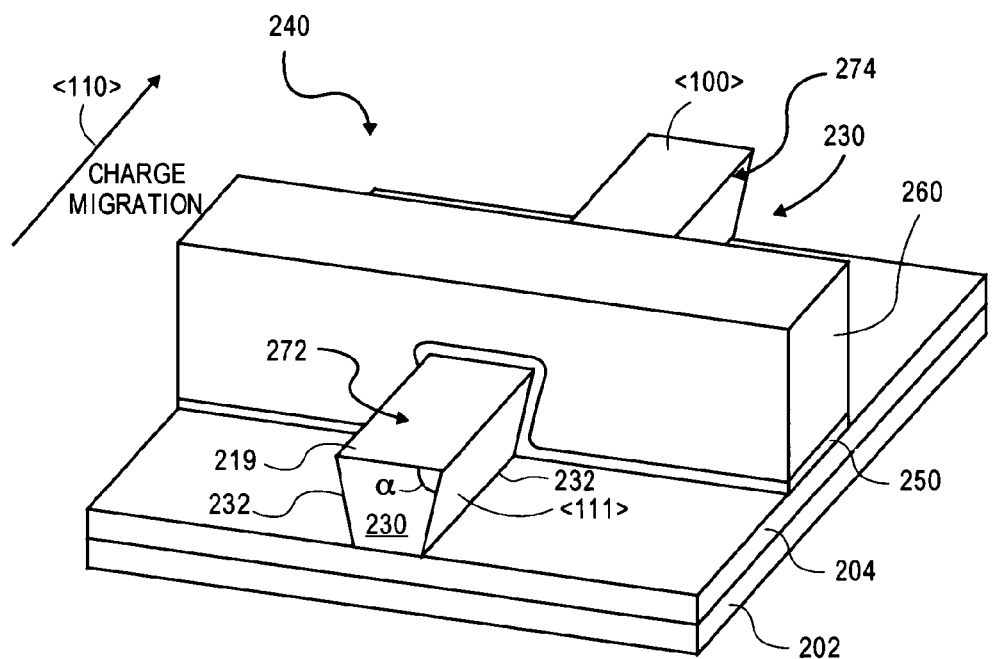
FIG. 2F is an illustration of a nonplanar transistor formed from the structure of FIG. 2E.

In an embodiment of the present invention, silicon structure 230 provides a silicon body or fin for a tri-gate transistor 240 illustrated in FIG. 2F. In order to fabricate a tri-gate transistor 240 as illustrated in FIG. 2F, hard mask 212 is removed from silicon structure 230. In an embodiment of the present invention, when hard mask 212 is a silicon nitride of silicon oxynitride film, a wet etch comprising phosphoric acid in de-ionized water may be used to remove the hard mask. In an embodiment of the present invention, the hard mask etchant comprises an aqueous solution of between 50-90% phosphoric acid (by volume) heated to a temperature between 150-170° C. and ideally to 160° C. In an embodiment of the present invention, after removing hard mask 212, the substrate can be cleaned utilizing standard SC1 and SC2 cleans. It is desirable to clean the substrate after removal of the hard mask with phosphoric acid because phosphoric acid typically includes many metallic impurities which can affect device performance or reliability. It is to be appreciated that if one desires to form a FINFET or a dual gate device, the hard mask 212 may be left on silicon structure 230 in order to isolate the top surface of the semiconductor structure 230 from control by a subsequently formed gate electrode.

Next, a gate dielectric layer 250 is thrilled on the sidewalls 232 as well as on the top surface of semiconductor body 230. Gate dielectric layer 250 can be any well known and suitable gate dielectric layer, such as but not limited to a silicon dioxide or silicon nitride gate dielectric layer. Additionally, gate dielectric layer 250 can be a high-k gate dielectric layer, such as but not limited to hafnium oxide, zirconium oxide, titanium oxide and tantalum oxide. Any well known technique, such as but not limited to chemical vapor deposition and atomic layer deposition may be utilized to form gate dielectric layer 250.

Next, a gate electrode 260 is formed on gate dielectric layer 250 on the to surface and sidewalk of semiconductor structure 230 as illustrated in FIG. 2F. Gate electrode 260 is formed perpendicular to sidewalls 232. The gate electrode can be formed from any well known gate electrode material, such as but not limited to doped polycrystalline silicon, as well as metal films, such as but not limited to tungsten, tantalum, titanium, and their nitrides. Additionally, it is to be appreciated that a gate electrode need not necessarily be a single material and can be a composite stack of thin films, such as but not limited to a lower metal film formed on the gate dielectric layer with a to polycrystalline silicon film. The gate dielectric layer and gate electrode may be formed by blanket depositing or growing the gate dielectric layer over the semiconductor body and then blanket depositing a gate electrode material over the gate dielectric layer. The gate dielectric layer and gate electrode material may then be patterned with well know photolithography and etching techniques to form gate electrode 260 and gate dielectric layer 250 as illustrated in FIG. 2F. Alternatively, the gate dielectric layer and gate electrode may be formed utilizing a well known replacement gate process. A source region 272 and a drain region 274 are formed in silicon body 230 on opposite sides of gate electrode 260 as illustrated in FIG. 2F. Any well known and suitable technique, such as solid source diffusion or ion implantation may be used to form source and drain regions. In an embodiment of the present invention, the source region 272 and drain region 274 are formed to a concentration between $1 \times 10^{19}$-$1 \times 10^{21}$ atoms/cm$^3$.

The fabricated nonplanar transistor 240 includes a semiconductor body 230 surrounded by gate dielectric layer 250 and gate electrode 260 as shown in FIG. 2F. The portion of the semiconductor body 230 located beneath the gate dielectric and gate electrode is the channel region of the device. In an embodiment of the present invention the source and drain region are doped to a first conductivity type (p type or p type) while the channel region is doped to a second opposite conductivity type (p type or n type) or is left undoped. When a conductive channel is formed by gate electrode 260 in the channel region of silicon body 230, charges (i.e., holes or electrons) flow between the source and drain region along the <110> plane in silicon body 230. That is, in transistor 240, charge migration is along the <110> crystal plane in structure 240, is has been found that charge migration in the <110> direction provides good hole mobility. Accordingly, in an embodiment of the present invention, device 240 is a p type device where the source and drain regions are formed to a p type conductivity and where the carriers are holes. Additionally, by inwardly tapering the sidewalls of silicon body 230, gate electrode 260 has good control over the channel region of body 230 enabling fast turn "on" and turn "off" of transistor 240.

Figure 3A:
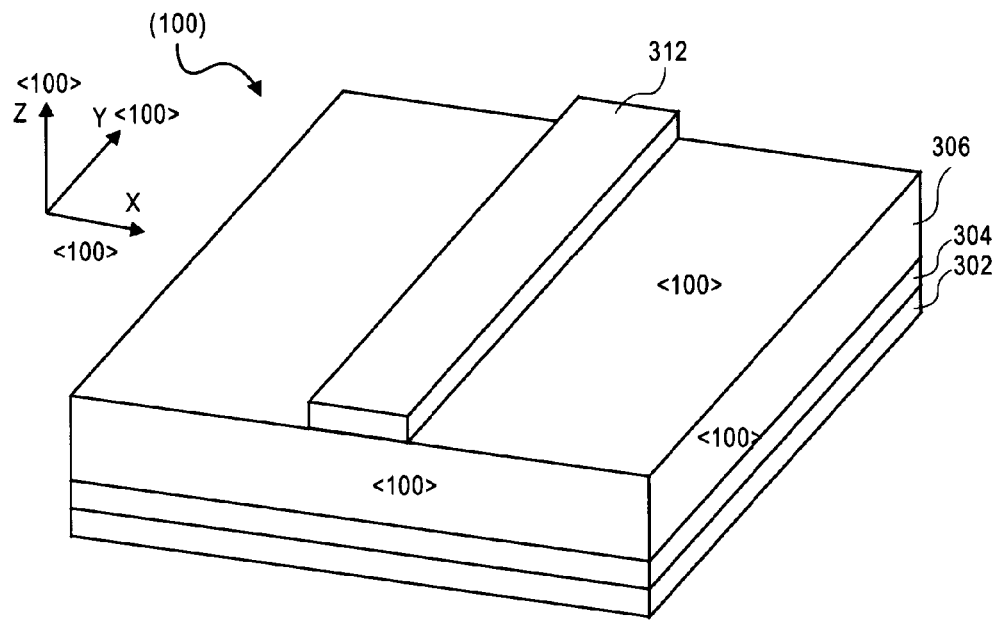
FIGS. 3A-3C illustrate a method of forming a semiconductor structure in accordance with embodiments of the present invention.

FIGS. 3A-310 illustrate a method of forming a monocrystalline silicon body or structure in accordance with another embodiment of the present invention. As shown in FIG. 3A, a hard mask 312 is formed on a single crystalline silicon film 306 having a (100) global crystal orientation. Hard mask 312 can be formed as described above. In FIG. 3A, however, the hard mask 312 is orientated on silicon film 306 to produce a pair of sidewalls which are aligned with the <100> plane and a second pair of sidewalls which are also aligned to the <100> plane. (It is to be appreciated that the orientation of hard mask 312 is rotated approximately 45° in the $\overline{xy}$ plane from the orientation of hard mask 212 in FIG. 2A.)

Figure 3B:
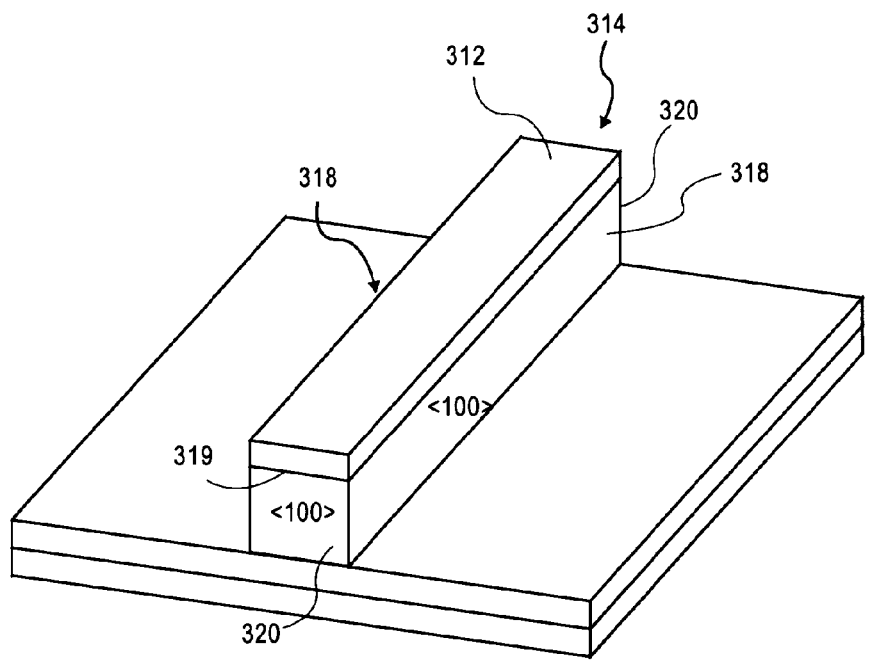

Next, as illustrated in FIG. 3B, the (100) global crystal orientation silicon film 306 is etched in alignment with the hard mask 312 to produce a silicon structure 314 which has a pair of laterally opposite sidewalls 318 which are aligned with the <100> plane and a second pair of sidewalls 320, which are perpendicular to the first pair and which are also aligned with the <100> plane. Silicon film 306 can be etched as described above.

Figure 3C:
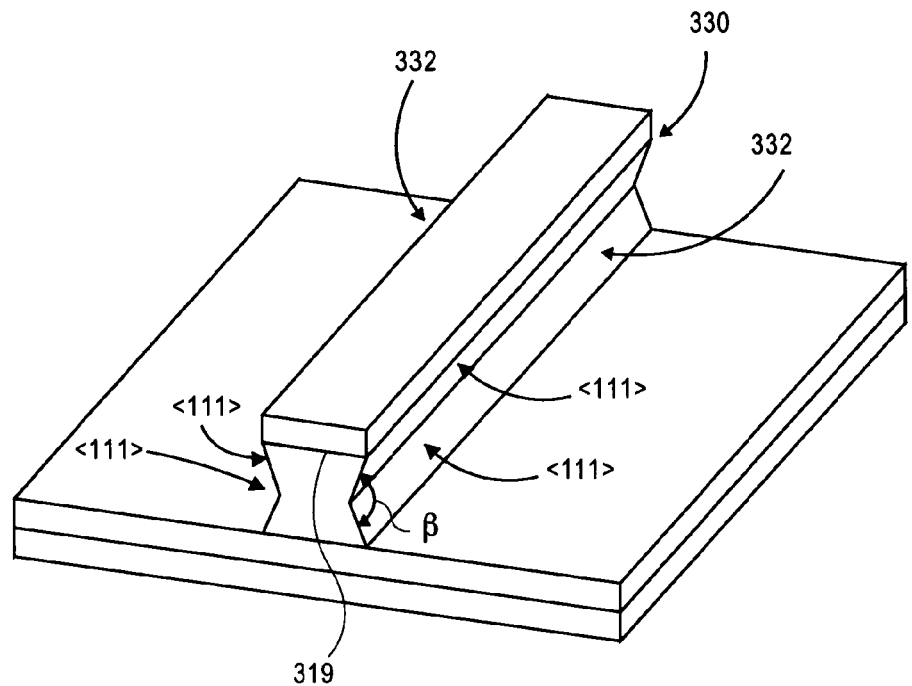

Next, the silicon structure 314 is exposed to a faceting wet etch while hard mask 312 is present on the top surface 319 of silicon structure 314. The faceting wet etch has a sufficient chemical strength to etch the less dense <110> and <100> planes but insufficient strength to etch the high density <111> plane. Because the less dense <100> plane on the top surface 319 of the silicon structure 314 is covered by the hard mask 312 and because the etch does not have sufficient chemical strength to etch the <111> plane, the silicon structure 314 is transformed into a silicon structure 330 having a pair of sidewalls 332 having a "V" notched shape formed by intersecting <111> planes as illustrated in FIG. 3C. As before, the faceting etch is self limiting, and stops at the first contiguous <111> planes. The <111> planes of sidewalls 332 meet at an angle β of approximate 55°. A combination of crystal orientation, atom shielding, and a well-controlled anisotropic wet etch enables the formation of silicon structure 330 with "V" notch sidewalls 332.

Figure 3D:
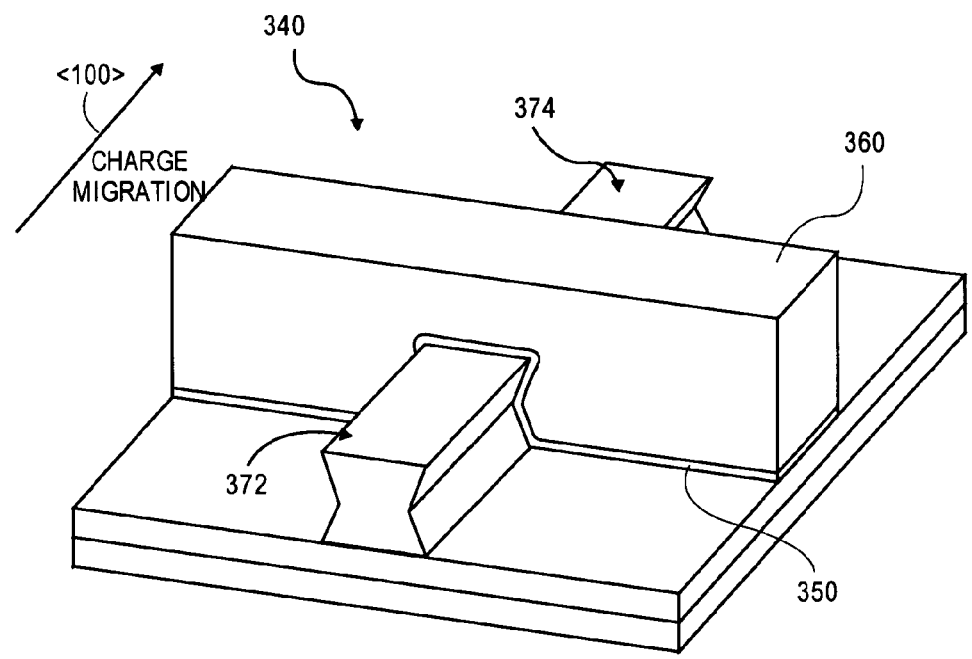
FIG. 3D is an illustration of a nonplanar transistor utilizing a semiconductor structure of FIG. 3C.

As discussed above, the silicon structure 330 can be used to create silicon nonplanar or three-dimensional devices as well as micro-machines and MEMS devices. In an embodiment of the present invention, the silicon structure 330 is used to form a nonplanar transistor, such as a tri-gate transistor 330 as illustrated in FIG. 3D. Gate electrode 360 is formed perpendicular to sidewalk 332 as shown in FIG. 3D. The nonplanar device has a gate dielectric layer 350 and a gate electrode 360 formed over and around a portion of silicon body 330 as illustrated in FIG. 3D. A source region 372 and a drain region 374 are formed in the silicon body 330 on opposite sides of the gate electrode. The charge migration from the source to the drain region in transistor 340 is parallel to or in alignment with the <100> plane. Because charge migration is along the <100> plane, the silicon structure 330 provides good electron mobility and is therefore ideal for use in the fabrication of an n type field effect transistor (NFET) where the carriers are electrons and the source region 372 and drain regions 374 are n type conductivity.

Figure 4A:
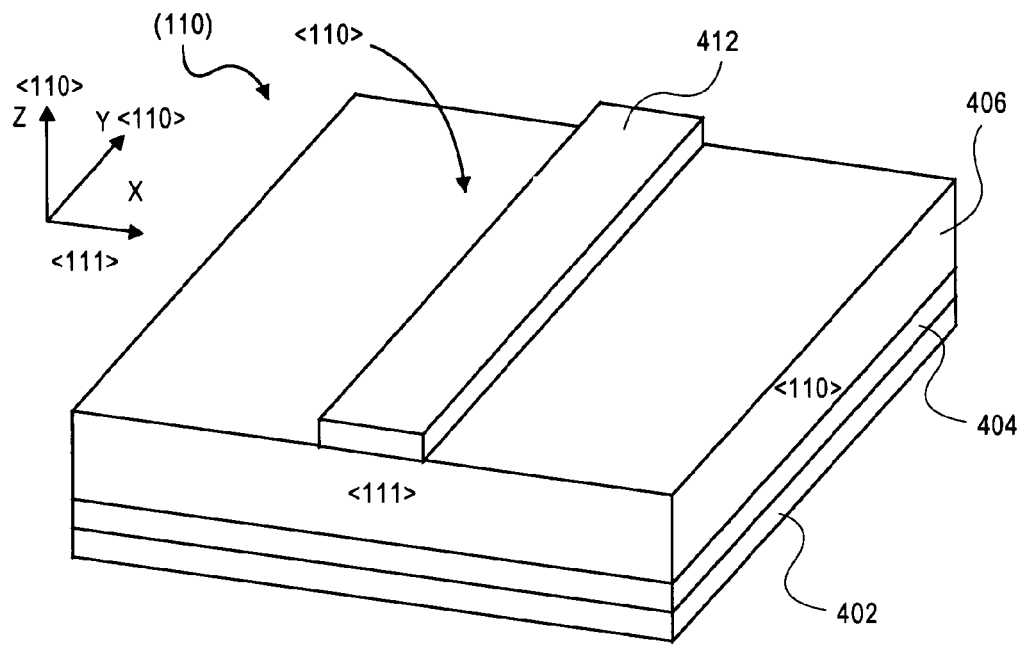
FIGS. 4A-4C illustrate a method of forming a semiconductor structure in accordance with embodiments of the present invention.

FIGS. 4A-4D illustrates a method of forming a semiconductor body or structure in accordance with another embodiment of the present invention. As shown in FIG. 4A, a substrate 400, such as a silicon on insulator (SOI) substrate which includes a lower monocrystalline silicon substrate 402, a buried oxide layer 404 and a single crystalline silicon film 406 is provided. Although, a silicon on insulator substrate 400 is ideally used, other well known semiconductor substrates can be used as set forth above. In an embodiment of the present invention, single crystalline silicon film 406 has a (110) global crystal orientation as shown in FIG. 4A. A single crystalline silicon film with a (110) global crystal orientation has a <110> plane of the silicon lattice which is planar to or parallel with the surface of the film. That is, as illustrated in FIG. 4A, a single crystalline silicon film with a (110) global crystal orientation has a <110> plane in the $\overline{xy}$ plane with a normal axis in the z direction. Additionally, a single crystalline silicon film with a (110) global crystal orientation has <111> planes and <110> planes which are orthogonal to each other and orthogonal to a <110> plane. That is, in a single crystalline silicon film 406 with (110) global crystal orientation there are <111> planes which lie in the $\overline{xz}$ plane with normal axis in the y direction and there are <110> planes which lie in the $\overline{zy}$ plane and have a normal axis in the x direction as shown in FIG. 4A. Next, a hard mask 412, as shown in FIG. 4A, is formed on single crystalline silicon film 406 having a (110) crystal orientation as described above. Hard mask 412 is orientated on silicon film 406 to produce a pair of sidewalk aligned with <110> plane and a second pair of perpendicular sidewalls which are aligned with the <111> plane. Hard mask 412 can be formed of materials and by methods described above.

Figure 4B:
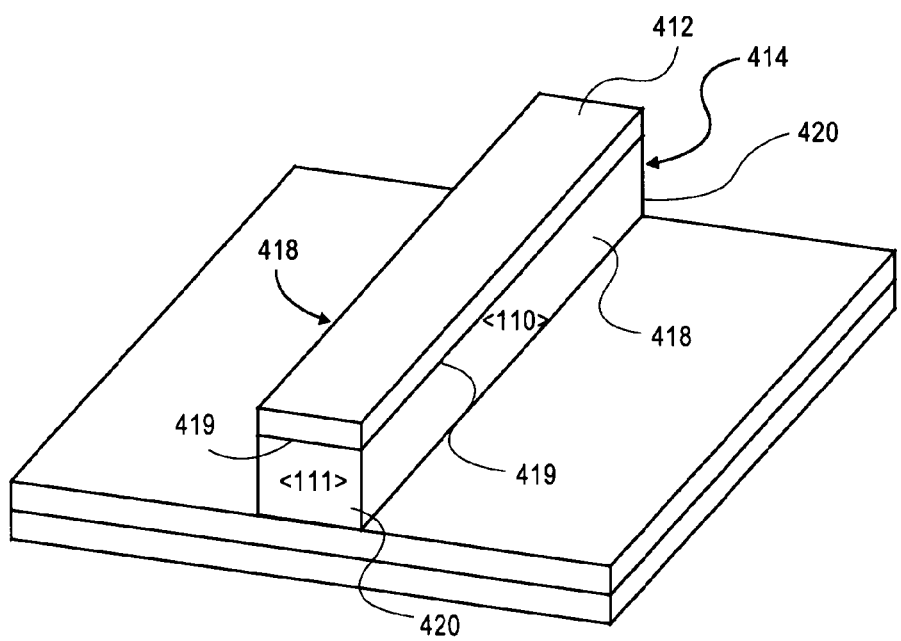
Figure 4C:
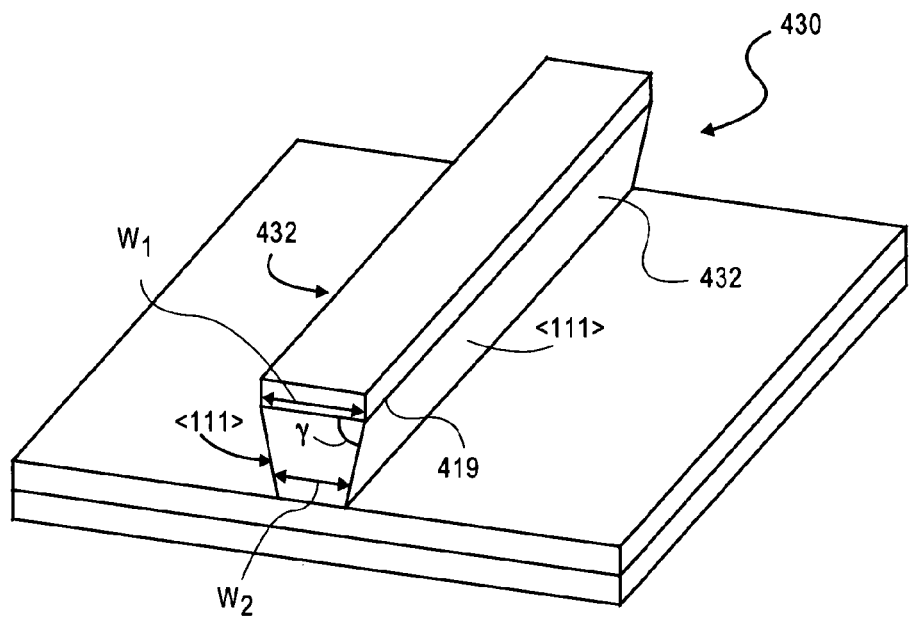

Next, as illustrated in FIG. 4B, the (110) silicon film is etched in alignment with hard mask 412 to produce a silicon structure 414 which has a pair of laterally opposite sidewalls 418 which are parallel with or aligned with the <110> plane and a second pair of sidewalls 420, which are perpendicular to the first pair 418 which are parallel with or aligned with a <111> plane. Hard mask 4112 capped silicon structure 414 is then exposed to a faceting wet etch. The faceting wet etch has sufficient chemical strength to etch the less dense <110> plane, but insufficient chemical strength to etch the higher density <111> plane. Because the less dense <110> plane of the top surface 419 is covered by hard mask 412 and because the etch does not have sufficient chemical strength to etch the <111> plane, structure 414 is transformed into structure 430 having a pair of laterally opposite sidewalls 432 defined by <111> planes as illustrated in FIG. 4C. After exposing structure 414 to the faceting etch for a sufficient period of time, the sidewalls 432 are defined by the <111> planes and generate a structure with a v-shape or inwardly tapered sidewalls. The sidewalk 432 angle inward from the top surface 419 of structure 430 at an angle gamma of approximately 62.5 degrees. In an embodiment of the present invention, the top surface 419 has a width (W1) between laterally opposite sidewalls 430 of between 20-30 nm and a bottom surface has width (W2) between laterally opposite sidewalk 440 of between 10-15 nm. A combination of crystal orientation, hard mask shielding, and a wet etch with the appropriate chemical strength enables the formation of silicon structure 430 with inwardly tapered sidewalls 432.

Figure 4D:
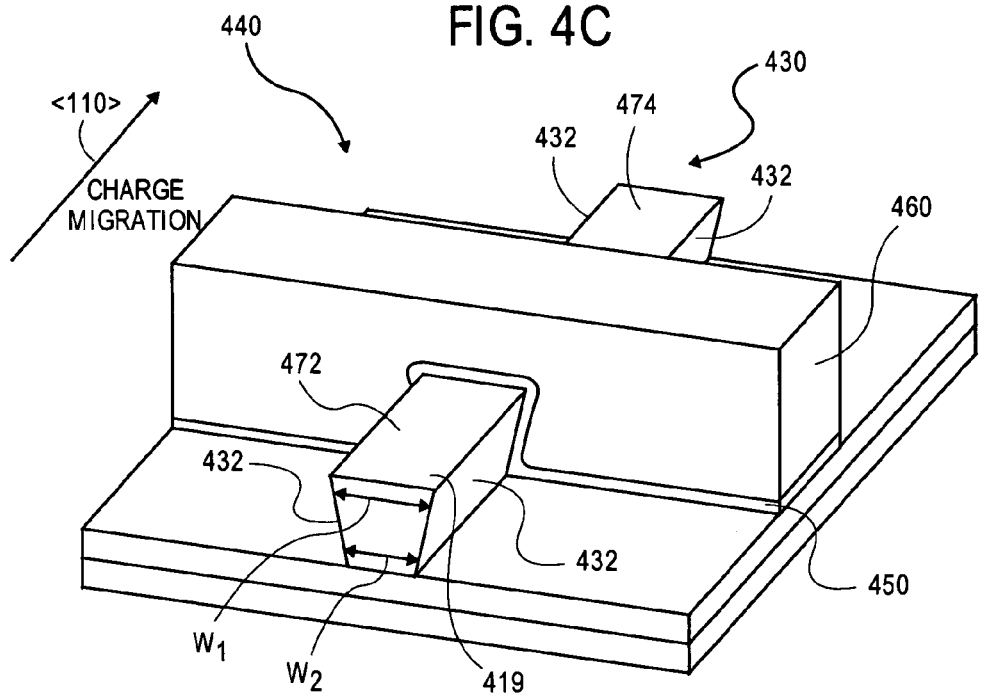
FIG. 4D is an illustration of a nonplanar transistor utilizing the semiconductor structure of FIG. 4C.

As discussed above, structure 430 can be used to create a variety of well known semiconductor devices, such as silicon nonplanar or three-dimensional devices, as well as opto-electronic devices and MEMS devices. In an embodiment of the present invention, the silicon structure 430 is used to form a silicon body of nonplanar transistor, such as a tri-gate transistor 440, as illustrated in FIG. 4D. The tri-gate transistor 440 has a gate dielectric layer 450 and a gate electrode 460 formed over and around a portion of silicon body 430 as illustrated in FIG. 4D. The gate electrode 460 runs in a direction perpendicular to sidewalls 432 as shown in FIG. 4D. The gate dielectric layer 450 and gate electrode 460 may be formed of any suitable material and suitable known method, such as described above. A source region 472 and a drain 474 are formed in silicon body 430 on opposite sides of gate electrode 460 as illustrated in FIG. 4D. The charge migration from the source region 472 to the drain region 474 in silicon body 430 is parallel to or in alignment with the <110> plane. The inwardly tapered sidewalls 432 of silicon body 430 provide good gate control 460 of the channel region of the device which enables the fast turn "on" and turn "off" of device 440.

Although the present invention thus far has been described with respect to the shaping or "faceting" of single crystalline silicon structures utilizing a combination of crystal orientation, hard mask shielding, and well controlled wet etchants, concepts of the present invention are equally applicable to other types of single crystalline semiconductor films, such as but not limited to germanium (Ge), a silicon germanium alloy ($Si_xGe_y$), gallium arsenide (GaAs), indium antimonide (InSb), gallium phosphide (GaP), and gallium antimonide (GaSb). For example, a single crystalline indium antimonide (InSb) structure can be faceted utilizing, a wet etchant comprising an aqueous solution of 0.05-0.1 mol/L citric acid at a temperature range between 5-15° C. Similarly, a single crystalline gallium arsenide (GaAs) structure can be faceted by exposing a hard mask covered gallium arsenide structure to a wet etchant comprising an aqueous solution of less than 0.05 mol/L citric acid at a temperature range between 5-15° C.

Figure 5:
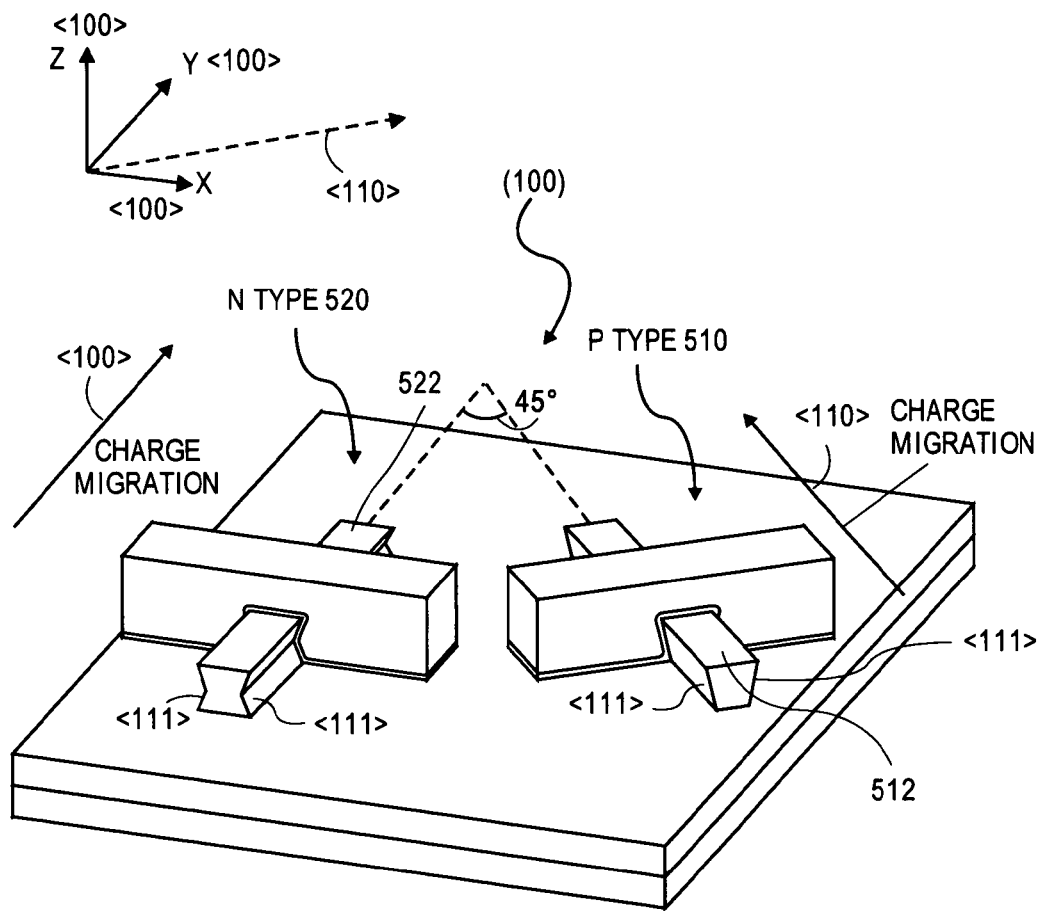
FIG. 5 is an illustration of a portion of an integrated circuit which includes an n type field effect transistor and a p type field effect transistor with a non parallel orientation on a substrate.

Additionally, in an embodiment of the present invention, an integrated circuit is formed from a p type transistor and an n type transistor 520 which are orientated and/or shaped to optimize the performance of each type of transistor. For example, as illustrated in FIG. 5, in an embodiment of the present invention a single crystalline silicon film having a (100) global crystal orientation is patterned as described with respect to FIGS. 2A-2F to form a silicon body 512 for a p type nonplanar transistor 510 wherein the charge (hole) migration is parallel with a <110> plane and is also patterned as described with respect to FIGS. 3A-3D to form a silicon body 522 for a n type nonplanar transistor 520 wherein charge (electron) migration is parallel with a <100> plane. Accordingly, in an embodiment of the present invention, a p type nonplanar transistor and an a type nonplanar transistor are orientated in a non-parallel (e.g., 45° C. offset) manner with respect to one another on a substrate in order to optimize the hole mobility for the p type transistor and the electron mobility for the n type transistor. In other embodiments of the present invention, the semiconductor bodies of the p type device and the a type device are oriented with respect to one another to enable the faceting etch to shape the bodies into structures which optimize performance tier each device type. In this way, the performance of an integrated circuit which includes both an a type nonplanar transistor and a p type nonplanar transistor can be greatly improved.

We claim:

1. A nonplanar transistor, comprising:
   a semiconductor body disposed on and continuous with a bulk monocrystalline silicon substrate, without an intervening insulating layer disposed between the semiconductor body and the bulk monocrystalline silicon substrate, wherein the semiconductor body comprises inwardly tapered sidewalls between two ends of the semiconductor body; and
   a gate electrode disposed over the semiconductor body and between the two ends of the semiconductor body.

2. The nonplanar transistor of claim 1, wherein each sidewall is flat from the top of the semiconductor body to the bottom of the semiconductor body.

3. The nonplanar transistor of claim 1, further comprising: a high-k gate dielectric layer disposed between the semiconductor body and the gate electrode.

4. The nonplanar transistor of claim 1, wherein the gate electrode is a metal gate electrode.

5. The nonplanar transistor of claim 1, wherein each sidewall is flat from the top of the semiconductor body to the bottom of the semiconductor body, and the nonplanar transistor further comprises a high-k gate dielectric layer disposed between the semiconductor body and the gate electrode.

6. The nonplanar transistor of claim 1, wherein each sidewall is flat from the top of the semiconductor body to the bottom of the semiconductor body, and wherein the gate electrode is a metal gate electrode.

7. The nonplanar transistor of claim 1, wherein each sidewall is flat from the top of the semiconductor body to the bottom of the semiconductor body, and wherein the gate electrode is a metal gate electrode, and the nonplanar transistor further comprises a high-k gate dielectric layer disposed between the semiconductor body and the gate electrode.

8. The nonplanar transistor of claim 1, wherein the gate electrode is a metal gate electrode, and the nonplanar transistor further comprises a high-k gate dielectric layer disposed between the semiconductor body and the gate electrode.

9. A nonplanar transistor, comprising:
   a semiconductor body disposed on and continuous with a semiconductor substrate, without an intervening insulating layer disposed between the semiconductor body and the semiconductor substrate, wherein the semiconductor body comprises inwardly tapered sidewalls between two ends of the semiconductor body; and
   a gate electrode disposed over the semiconductor body and between the two ends of the semiconductor body.

10. The nonplanar transistor of claim 9, wherein each sidewall is flat from the top of the semiconductor body to the bottom of the semiconductor body.

11. The nonplanar transistor of claim 9, further comprising: a high-k gate dielectric layer disposed between the semiconductor body and the gate electrode.

12. The nonplanar transistor of claim 9, wherein the gate electrode is a metal gate electrode.

13. The nonplanar transistor of claim 9, wherein each sidewall is flat from the top of the semiconductor body to the bottom of the semiconductor body, and the nonplanar transistor further comprises a high-k gate dielectric layer disposed between the semiconductor body and the gate electrode.

14. The nonplanar transistor of claim 9, wherein each sidewall is flat from the top of the semiconductor body to the bottom of the semiconductor body, and wherein the gate electrode is a metal gate electrode.

15. The nonplanar transistor of claim 9, wherein each sidewall is flat from the top of the semiconductor body to the bottom of the semiconductor body, and wherein the gate electrode is a metal gate electrode, and the nonplanar transistor further comprises a high-k gate dielectric layer disposed between the semiconductor body and the gate electrode.

16. The nonplanar transistor of claim 9, wherein the gate electrode is a metal gate electrode, and the nonplanar transistor further comprises a high-k gate dielectric layer disposed between the semiconductor body and the gate electrode.

* * * * *